July 13, 1971 A. MÜLLER 3,592,773

SOLVENT MIXTURE WITH NITRIC ACID AND HYDROFLUORIC ACID
FOR WET CHEMICAL ETCHING OF SILICON

Filed March 25, 1968

3,592,773

SOLVENT MIXTURE WITH NITRIC ACID AND HYDROFLUORIC ACID FOR WET CHEMICAL ETCHING OF SILICON

Alfred Müller, Erlangen, Germany, assignor to Siemens Aktiengesellschaft, Berlin and Munich, Germany Filed Mar. 25, 1968, Ser. No. 715,805
Claims priority, application Germany, Mar. 23, 1967, S 108,980
Int. Cl. H01l 7/50; C09k 3/00
U.S. Cl. 252—79.3 9 Claims

ABSTRACT OF THE DISCLOSURE

Described is a solvent mixture of nitric acid and hydrofluoric acid for wet chemical etching of silicon objects. The solvent mixture is characterized by the incorporation of at least one addition to the mixture. This addition reacts with nitrous acid and with nitrogen oxides present through the chemical equilibrium of nitrous acid with nitrogen oxide. The additions are primary or secondary aliphatic or aromatic amines, simple and N-substituted acid amides, hydrazine and hydroxylamine, their derivatives and salts and S—N compounds which contain =NH or —$NH_2$ groups. Illustratory additions are carbamide, cyclohexylamine, gelatine and hydrazine.

SPECIFICATION

The wet chemical etching of silicon is frequently an important step during the production of silicon device components, particularly integrated circuits. The desired etching effects vary, therefore requiring differing etching solutions and etching methods to achieve the desired results. For example, there are etching agents which are used to show errors or faults in the crystal structure whereas other etching agents are used to shape the devices.

A fundamental task of wet chemical etching in the production of many silicon components is to provide sufficiently planar silicon surfaces, without the crystal disturbances which occur by mechanical processing. Hence, an etching solution must be found with whose aid the surface layer of sawed or of sawed and lapped silicon bodies, for example silicon wafers, may be removed. This removal is to eliminate the damage layer, caused by mechanical processes such as sawing or lapping and to provide a sufficiently planar and reflecting surface for further processing.

Also, a solution must be found to the problem of how by wet chemicals to polish and even make planar parallel a lapped, and possibly already polished, wafer of conventional diameter (for example 18 to 33 mm.) through removal of a layer of for example at most 400$\mu$, or to maintain an already existing plane parallelism.

Of all the known acid or alkaline etching solutions, only the etching agents of the system nitric acid/hydrofluoric acid diluent (such as water or acetic acid) make it possible to obtain polished surfaces on sawed or lapped wafers. These etching agents which may contain, for example, eight volumes of nitric acid (65% $NHO_3$) and one volume of hydrofluoric acid (40% HF), under normal etching conditions, considerably round the silicon discs. Thus, following a wet chemical removal of a total of about 200$\mu$ in a nitric acid/hydrofluoric mixture of appropriate combination, the thickness of a previously plane parallel lapped wafer, with a diameter of approximately 20 mm., may differ by approximately 10 to 50$\mu$ from its center to its edge. It is constantly observed that the peripheral regions are thinner than the center of the disc. If the silicon does not have a very homogeneous distribution of doping material, the thickness of the disc will first decrease steadily from the center toward the periphery and then will decrease even more steeply, directly at the periphery. Because of the aforedescribed phenomenon, cumbersome grinding and polishing can usually not be avoided when flat, polished and undamaged silicon surfaces are needed. Certain production methods for device components, as for example the "epic technique," can be carried out only with a plane parallel removal of silicon layers approximately 200$\mu$ thick.

My invention faced the added task of carrying out a wet chemical etching of silicon with $HNO_3$/HF mixtures while avoiding or greatly diminishing the rounding of the previously planar silicon object without losing the slight roughness of the etched silicon surface needed in the production of device components.

To this end it was helpful, first of all, to find an explanation for the previously occurring rounding of the discs. Almost all treatises dealing with the etching of silicon with $HNO_3$/HF mixtures state that the reaction is effected by autocatalysis; e.g. H. Robbins and B. Schwartz in J. Electrochem. Soc. 106, 505 (1959), J. Electrochem. Soc. 107, 108 (1960) and J. Electrochem. Soc. 108, 365 (1961). The oxidation of silicon is not effected primarily by nitric acid but, and many theories are available, by nitrous acid ($HNO_2$) or by nitrogen oxides, whose oxidation number is smaller than 5. These oxidation agents are derived in rather large amounts from the symmetrical proportioning of nitrous and nitric acid, as soon as traces of $HNO_2$ appear. These traces are formed by the very slow oxidation of silicon with $HNO_3$. Thus, the silicon surface is covered by a thin reactive layer of a composition differing from the rest of the solution. This "reactive layer" contains nitrogen oxides such as $NO_2$, $N_2O_4$, $N_2O_3$ or NO and nitrous acid which is in equilibrium with them. These compounds which contain nitrogen with oxidation numbers smaller than five, very quickly oxidize the silicon. Their reduction products are regenerated by the nitric acid of the main body of etching solution.

In $HNO_3$/HF mixtures rich in nitric acid, the speed at which silicon is dissolved is determined by the diffusion of hydrofluorc acid through the reactive layer, as well as by the formation and diffusion of $SiF_6^{2-}$ into the solvent. Though no exact information can be supplied concerning the thickness of the reactive layer above the silicon surface, and this layer may possibly be only 0.1 to 10$\mu$ thick, it must be assumed that the form of said layer does not represent the form of the silicon surface to be etched. The form of the reactive layer will rather be variously shaped depending on flow conditions, namely the thicker the layer, the more curving. It can further be assumed that the reduction of the thickness of the reactive layer at the periphery of the silicon surface, for example the edge of a silicon wafer, will shorten the diffusion period from the hydrofluoric acid to the silicon surface, during the etching process, thus leading to a roundness of said surface.

The present invention provides a solvent mixture with nitric acid and hydrofluoric acid, for wet chemical etching of particularly plane parallel, sawed and/or lapped silicon surfaces, and is characterized by the admixture of at least one addition to the mixture. This addition reacts with nitrous acid and possibly reacts with nitrogen oxides, through the chemical equilibrium of nitrogen oxides with nitrous acid.

According to a further development of the present invention, such additions are primary or secondary aliphatic and aromatic amines, simple or not N-substituted acid amides, hydrazine and hydroxylamine as well as their derivatives and salts, and all the S—N compounds which contain =NH or —$NH_2$ groups. For example, hydrazine or hydrazine salt, carbamide, a carbamide salt such as carbamide nitrate, cyclohexylamine or gelatine may be used as additions.

The additions are preferably so selected and added to the etchant in such amounts, that the speed of removal at the edge of a wafer and at a distance therefrom is essentially the same. At the same time, the thickness of the reactive boundary layer is advantageously reduced so much, by changing its composition, that a bending or curving of said boundary layer toward the wafer edge becomes negligibly small.

It may also be advantageous to utilize the teaching of the present invention, i.e. of varying the etching behavior of the etchant nitric acid/hydrofluoric acid with respect to silicon, by adjusting the flow conditions of the etching solution, which shape the boundary of the reactive layer, in relation to the remaining etching solution, up to the vicinity of the wafer edge, in parallel to the latter. It is particularly favorable to adjust the flow conditions of the etching solution, during the etching process, through a relative movement of the etching agent and the silicon disc, so that the boundary of a reactive layer of nitrogen oxides, occurring on the silicon wafer, is in equilibrium with the nitrous acid in the rest of the etching solution in the vicinity of the wafer edge and parallel to the same.

The etching agent of the present invention permits a comfortable etching rate at room temperature, or slightly higher temperature, preferably 20 to 25° C.

From the plurality of chemical substances which may be used as additions in accordance with the present invention, four representative materials, namely hydrazine, carbamide, cyclohexylamine and gelatin, will be described in greater detail. These examples will illustrate the effectiveness of the present invention as supplement in nitric acid/hydrofluoric acid mixtures for silicon etching.

The examples described hereinbelow, which are illustratory only and are not limiting of the present invention, will be described with reference to the drawing, in which:

FIGS. 1 and 2 respectively show the surface profiles of silicon wafers etched with $NHO_3$/HF with additives of carbamide and gelatine;

Figure 1:
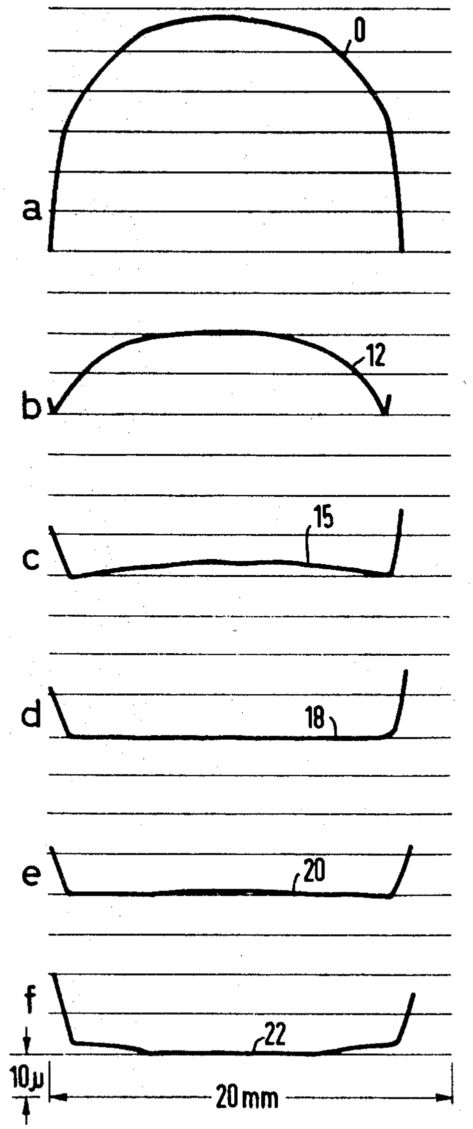
Figure 2:
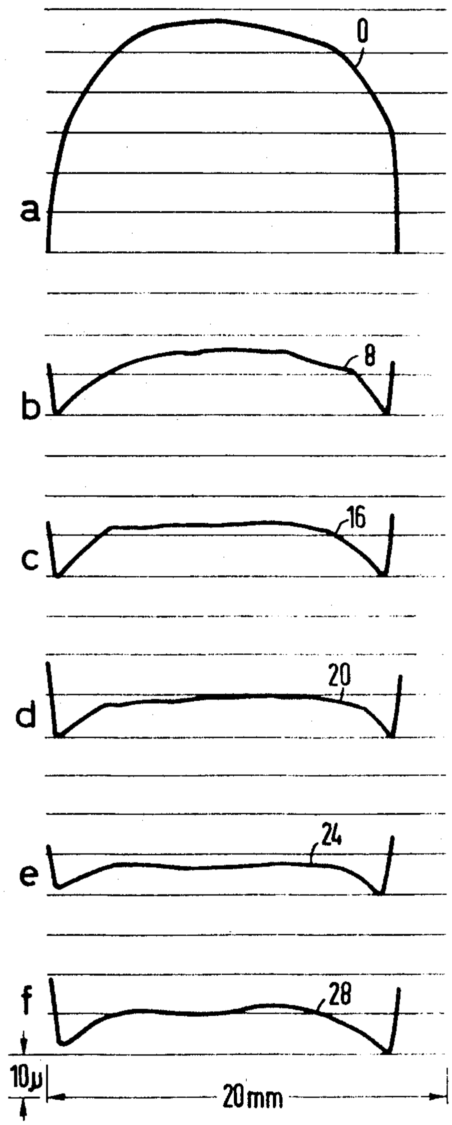

Due to the strong influence exerted by the type of flow during the etching process, a comparative evaluation of the etching behavior of etchants, modified in accordance with the present invention, is only possible if the etching conditions are always comparable. If the test conditions are changed, the etching behavior of an individual etchant will differ. I have discovered, however, that the modified etching agents may be arranged sequentially corresponding to their etching behavior which remains the same during different types of movements of the silicon samples.

In connection with the embodiment examples, etching agents and samples were moved in a centrifuge at constant speed. The liquid was removed at a rate corresponding approximately to that of a solution removed for titration in an Erlenmeyer flask. A circular wafer, inserted into the liquid, rolled upright, along the vessel wall, more or less quickly.

The results of numerous etching tests were compiled into the following examples:

EXAMPLE 1.—HYDRAZINE, $N_2H_4$

Hydrazine or its salts can considerably slow up the chemical etching of silicon in $HNO_3$/HF mixtures. Even 2 g. $N_2H_5 \cdot HSO_4$ in 100 ml. $HNO_3$/HF mixture of any given composition completely prevented the dissolution of silicon, especially if the silicon sample was moved in the etching medium. A stationary sample may result in the buildup of a reactive layer, whose nitrogen oxide and nitrous acid can only relatively slowly be reduced by the hydrazine, dissolved in the etching agent, so that there is no noticable dissolution of the silicon. The following etching conditions were obtained with 0.5 g. $N_2H_5 \cdot HSO_4$ in 100 ml. $HNO_3$/HF, at 20° C.: etching agents containing over 70% by volume of concentrated $HNO_3$ showed almost the same etching rates as acid mixtures, which were not modified in accordance with the present invention. The etching rates were lower in the range between 45 and 70% by volume of concentrated $HNO_3$. The maximum etching speed occurred with modified etching agents between 42 and 45% by volume of concentrated $HNO_3$. The thickness of a silicon wafer was reduced approximately 230$\mu$, after an etching period of 1 min. No dissolving of silicon occurred in etching agents with less than 35% by volume of concentrated $HNO_3$.

Additions of hydrazine or its salts to $HNO_3$/HF mixtures are primarily of interest for the following reasons.

(1) For a quick stoppage of a chemical etching taking place, by adding hydrazine to the acid mixture after a selected time.

(2) For dissolving other layers, e.g. metals applied to the silicon sample, in $HNO_3$/HF mixtures, without dissolving the silicon. To this end, hydrazine or its salts may be added to the acid mixture, even at the start of etching.

EXAMPLE 2.—CARBAMIDE, $OC(NH_2)_2$

Carbamide, the diamide of carbon dioxide, forms with nitrogen acid a salt $OC(NH_2)_2 \cdot HNO_3$, which is only slightly soluble in water. The solubility of carbamide nitrate is further reduced in aqueous solutions containing $HNO_3$.

For example, 5 g. carbamide could no longer be completely dissolved in 176 ml. $HNO_3$ and 22 ml. HF, at 25° C. Due to this limited solubility, the speed of dissolving silicon could not be very much reduced by carbamide in $HNO_3$/HF mixtures. By adding larger amounts of carbamide to the etching agent, however, the etching rate was slowly reduced, since the carbamide, reacted by nitrous acid, was supplied the faster, the more undissolved carbamide nitrate was present. Thus, the etching speed on a lapped silicon surface was reduced, in a mixture of 352 ml. concentrated $HNO_3$ and 44 ml. concentrated HF, at 24° C., from 10$\mu$/min. to 8$\mu$/min., when 32 g. carbamide were added to the etching agent as $OC(NH_2)_2 \cdot HNO_3$. This slight effect upon the etching rate was compensated, however, by a reduction in the disc roundness, during etching.

FIG. 1 shows surface profiles *a* to *f* of silicon wafers, which are measured after a wet chemical removal of apporximately 120$\mu$. Prior to etching, the wafers were polished flat with Barton garnet. The numbers shown in the profiles of FIG. 1 indicate the amount of carbamide in grams, which was added as carbamide-nitrate mixture in 176 ml. concentrated $HNO_3$ and 22 ml. concentrated HF. The temperature of the etching agent was 24° C., the etching period lasted about 13 minutes. A scale is shown in this figure as to the depth of etching.

The planar base surfaces of the cylindrical discs, which were at first plane parallel, appeared to be more or less convex after the etching process. In a conventional non-modified etching agent, the bulging, schematically drawn in FIG. 1*a*, was more than 50$\mu$, after a 120$\mu$ thick layer (measured at the center of the disc) had been removed. An increase in the amount of carbamide, added in accordance with the present invention, reduced the bulging of the etched discs (FIGS. 1*b* to 1*e*). Finally, the surface was slightly concave (FIG. 1*f*).

Even with small amounts of the added carbamide, the disc periphery remained raised. The difference in the height of the profile in the center of the disc and 2 mm. from its edge was 17, 9, 3.5, 0.5, 2.5 and —2.5$\mu$ for additions of 0, 12, 15, 18, 20 and 22 g. carbamide as $OC(NH_2)_2 \cdot HNO_3$ to 200 ml. etching solution at a removal of 120$\mu$. In the same order, the polish of the etched surfaces became worse. While the first three samples (FIGS. 1*a* to 1*c*) had mirror-like surfaces, the remaining samples (FIGS. 1*d* to 1*f*) had only a more or less mirror gloss, as well as a microscopic structure. During etching in each of the described solvent mixtures, modified in accordance with the present invention, the polish of the silicon surface improved proportionally to the greater amount of silicon being removed. However, when as a layer of about 200$\mu$ was removed from the lapped silicon surface, the polish of the surface changed only negligibly.

EXAMPLE 3.—CYCLOHEXYLAMINE, $H_2N \cdot C_6H_{11}$

Additions of the primary amines $H_2N \cdot C_6H_{11}$, added to $HNO_3$/HF mixtures, considerably reduced the etching rate for silicon, with satisfactory polishing effects. The etching speed in 176 ml. concentrated $HNO_3$ and 22 ml. concentrated HF with additions of 10 or 35 ml. cyclohexylamine, at 24° C., amounted to 6 or 3$\mu$/min. When a layer of 100$\mu$ was removed with an etching agent, comprised of 176 ml. $HNO_3$, 22 ml. HF and 20 ml. $H_2N \cdot C_6H_{11}$, the polish of the etched silicon surface was better than that of a sample wherefrom a layer of 100$\mu$ had also been removed, with the aid of an etching agent, not modified according to the present invention (176 ml. $HNO_3$+22 ml. HF). The waviness in the sample obtained in the modified etching agent was less than 0.5$\mu$ and the roughness below 0.2$\mu$.

The profiles of discs which were etched in $HNO_3$/HF mixtures, with additions of cyclohexylamine, compared largely to those of the 4th embodiment example, which follows. As in Example 2, a large addition of amine (35 ml. $H_2N \cdot C_6H_{11}$, added to 176 ml. $HNO_3$ and 22 ml. HF) led to an increase in roughness. The surface obtained by etching had gloss and microscopic structure.

EXAMPLE 4.—GELATINE

Gelatine is quickly soluble in $HNO_3$/HF mixtures. Hydrolysis occurred either faster or slower depending on the product used. The hydrolysis led to smaller peptide chains and to the amino acids from which it was built. A reproduceable etching behavior was obtained after suspension of gelatine in the etching agent up to complete dissolution of the gelatine, for about 10 minutes. In 176 ml. concentrated $HNO_3$ and 22 ml. concentrated HF, at 24° C., with an addition of 8, 16, 20, 24 and 28 g. gelatine, the etching speed for silicon was 6.2, 5.6, 4.8, 4.6 and 4.2$\mu$/min. Thus, gelatine is suitable to reduce the rate of etching for silicon in $HNO_3$/HF mixtures.

FIGS. 2*b* to 2*f* show surface profiles of silicon samples, wherein layers of about 80$\mu$ thickness were removed by etching in a solvent, modified with gelatine, in accordance with the present invention. FIG. 2*a* corresponds to FIG. 1*a*, i.e. no additive. The numbers in the profiles show the amount of gelatine in grams added to 176 ml. concentrated $HNO_3$ and 22 ml. concentrated HF. The temperature of the etching bath was 24° C., the etching time about 16 minutes.

The difference in the profile height in the center of the disc, and 2 mm. from its edge, amounted in the tests, shown in FIGS. 2*b* to 2*f*, from top to bottom, to 17, 8.5, 7.0, 3.5, 4.0$\mu$. All samples which were removed in the etching agent, modified with gelatine, had an elevated periphery.

Here, as in Example 2 with hydrazine, the quality of the polish decreased at an increased addition of gelatine. It did not change considerably in all compositions of the solvent, when layers of 50$\mu$ thickness were removed from lapped discs, lapped for example by Barton garnets. With a layer of 100$\mu$, in 176 ml. $HNO_3$, 22 ml. HF, 8 g. gelatine, the waviness of the etched silicon surface was less than 0.5$\mu$, and the roughness less than 0.1$\mu$.

These very different examples with materials far removed from the chemical viewpoint, and the numerous tests show that the known system $HNO_3$/HF diluent, used for etching silicon, may be modified as to its etching behavior by adding supplements, in accordance with the present invention. The supplements consist of compounds which can react with $HNO_2$ and nitrogen oxides, and represent primary and secondary amines, acid amides and amino acids and belong to the group of organic as well as inorganic compounds.

The etchant of the present invention may be used to great advantage in the production of semiconductor device components in accordance with the so-called "epic technique." Device components produced by this method contain one or more active regions which are monocrystalline and doped, and which may be provided with p-n junctions. These active regions are generally separated from each other and isolated from the polycrystalline, basic semiconductor substance by oxide layers.

Figure 3:
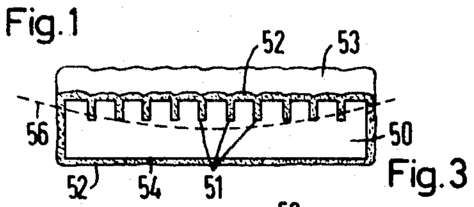
FIG. 3 shows the effect of conventional etching.
Figure 4:
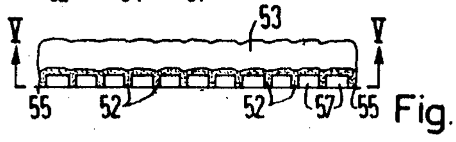
FIG. 4 shows the effect of etching according to my invention.
Figure 5:
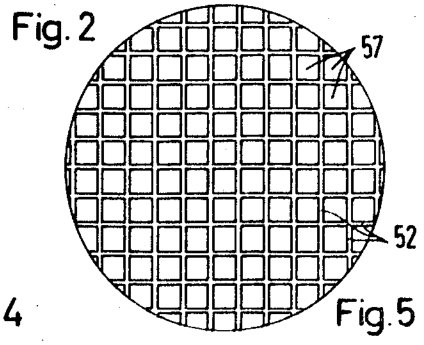
FIG. 5 is a cross section along V—V in FIG. 4.

In FIGS. 3 to 5 which are schematic, the same parts have the same reference numerals. These figures illustrate the importance of the solvent of the present invention during the simultaneous production of a plurality of the aforementioned components, from a silicon disc.

In an embodiment example, a monocrystalline silicon disc 50 of FIG. 3 is provided, for example, with etched ditches 51 by masking, and applying the solvent of the present invention. These ditches may form any desired pattern on the semiconductor surface. They may be intended as a boundary for an entire component (in the silicon disc) or for regions of a component and may be, e.g. 10 to 20$\mu$ deep. Following the masking of the ditches, preferably the entire silicon disc, or at least the surface provided with the ditches, is given an oxide layer 52. This is in such a way that ditches are also filled with oxide. Thereafter, a silicon layer 53, which for example is polycrystalline, is grown upon the oxide layer of the surface provided with the ditches.

The thus prepared semiconductor disc, which may be of arbitrary shape (round or angular) is usually separated by etching from the monocrystalline bottom side 54. The solvent of the present invention is especially suitable for this etching step. Since the monocrystalline silicon disc 50 is usually etched down to the bottom of the ditches 51, i.e. approximately to line 55 in FIG. 4, it is very desirable to effect the etching so that the semiconductor material is etched at the same speed over the entire surface. If, for example, the etching is done faster at the edge of the disc than in the center of the disc surface, i.e. approximately along the dotted line 56 in FIG. 3, then the components in the center of the disc would not yet be exposed while the active, monocrystalline regions at the edge of the disc would be almost etched off.

As the actvie regions, indicated as 57 in FIG. 4, are frequently only about 10$\mu$ thick, a great uniformity in etching the silicon surface is of primary importance to this "epic technique." The use of the etchant or the method of the present invention results in excellent planarity.

FIG. 5 is a section along the line V—V of FIG. 4 and is a schematically drawn top view of a silicon disc surface, etched in accordance with the present invention, wherein the bottom of the ditches 51 and the active regions 57 have been exposed.

The modification of the etching behavior of known etching agents, in accordance with the present invention, represents great progress in the art of silicon device components. The present invention offers valuable means and methods for reducing or avoiding disc roundness, during the etching of silicon samples, which originally had lapped or polished planar surface, i.e. surface without any crystal damage.

I claim:

1. A solvent mixture of nitric acid and hydrofluoric acid for wet chemical etching of silicon objects with at least one addition to the mixture, said nitric acid and said hydrofluoric acid being in an 8:1 ratio, said addition reacting with nitrous acid and with nitrogen oxides which are present through the chemical equilibrium of nitrous acid with nitrogen oxides, said addition being selected from primary, secondary aliphatic and aromatic amines, simple and N-substituted acid amides, hydrazine and hydroxyl amine, their derivatives and salts and S—N compounds which contain ⊢NH or —$NH_2$ groups.

2. The method of claim 1, wherein the addition is carbamide salt, with a maximum of 22 g. to 200 ml. of solvent mixture.

3. The method of claim 1, wherein the addition is a carbamide salt with a maximum of 22 g. to 200 ml. of solvent mixture.

4. The method of claim 3, wherein the addition is carbamide nitrate with a maximum of 22 g. to 200 ml. of solvent mixture.

5. The method of claim 1, wherein the addition is cyclohexylamine with a maximum of 35 ml. to 200 ml. of solvent mixture.

6. The method of claim 1, wherein the addition is gelatine with a maximum of 28 g. to 200 ml. of solvent mixture.

7. The method of claim 1, wherein the addition is hydrazine with a maximum of 2 g. to 100 ml. of solvent mixture.

8. The method of etching silicon discs with the solvent mixture of claim 1, wherein the flow conditions during the etching process are established in the etching agent through a relative movement of the etching agent and the silicon disc so that the boundary of a reactive layer of nitrogen oxides formed upon said disc is in equilibrium with nitrous acid in the remaining etching solution parallel to the disc surface.

9. The use of the solvent of claim 1 for the simultaneous production of a plurality of silicon device components with monocrystalline, active regions separated by oxide layers from the base semiconductor substance of the device component, for etching off the monocrystalline silicon discs, provided on one surface with a ditch pattern, the surface of said ditch being oxidized, a layer of silicon applied thereon, from the surface opposite said ditch surface, down to the bottom of the ditches.

References Cited

UNITED STATES PATENTS

| | | | |
|---|---|---|---|
| 2,927,011 | 3/1960 | Stead | 252—79.4X |
| 3,160,539 | 12/1964 | Hall et al. | 156—17 |

JACOB H. STEINBERG, Primary Examiner

U.S. Cl. X.R.

156—17; 252—79.4